United States Patent
Nakasuji

(10) Patent No.: US 6,831,281 B2
(45) Date of Patent: Dec. 14, 2004

(54) METHODS AND DEVICES FOR DETECTING AND CANCELING MAGNETIC FIELDS EXTERNAL TO A CHARGED-PARTICLE-BEAM (CPB) OPTICAL SYSTEM, AND CPB MICROLITHOGRAPHY APPARATUS AND METHODS COMPRISING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/996,527

(22) Filed: Nov. 28, 2001

(65) Prior Publication Data

US 2002/0121615 A1 Sep. 5, 2002

(30) Foreign Application Priority Data

Dec. 4, 2000 (JP) ........................................ 2000-368005

(51) Int. Cl.[7] .............................. H01J 37/02; H01J 1/52
(52) U.S. Cl. ........................... 250/492.22; 250/396 ML
(58) Field of Search ......................... 250/492.22, 492.2, 250/396; 324/318, 319, 320, 322; 313/440, 431

(56) References Cited

U.S. PATENT DOCUMENTS

| | | | | |
|---|---|---|---|---|
| 3,749,964 A | * | 7/1973 | Hirata | 250/398 |
| 3,801,877 A | * | 4/1974 | Griese et al. | 361/146 |
| 5,117,155 A | * | 5/1992 | Buhler | 315/8 |
| 5,126,669 A | * | 6/1992 | Honess et al. | 324/261 |
| 5,225,999 A | * | 7/1993 | Luzzi | 702/85 |
| 5,304,811 A | * | 4/1994 | Yamada et al. | 250/492.22 |
| 6,194,732 B1 | * | 2/2001 | Okino | 250/491.1 |
| 6,208,135 B1 | * | 3/2001 | Shattil | 324/225 |
| 6,707,301 B2 | * | 3/2004 | Goto | 324/313 |
| 2002/0038852 A1 | * | 4/2002 | Suzuki | 250/396 ML |
| 2003/0214296 A1 | * | 11/2003 | Carlini et al. | 324/309 |

* cited by examiner

*Primary Examiner*—Frank G. Font
*Assistant Examiner*—James P. Hughes
(74) *Attorney, Agent, or Firm*—Klarquist Sparkman LLP

(57) ABSTRACT

CPB microlithography systems are disclosed that effectively cancel the effects of floating external magnetic fields and that exhibit a high magnetic shielding ratio using small components. An exemplary system includes a search coil situated and configured to detect external magnetic field, and a compensation coil situated and configured to produce a magnetic field that, based on the detected magnetic field, cancels the external magnetic field. These coils desirably are situated downstream of an illumination lens. The external magnetic field detected by the search coil is converted to a corresponding electrical signal by an external-magnetic-field-detection circuit and routed to an external-magnetic-field-compensation circuit to which the compensation coil is connected. The external-magnetic-field-compensation circuit cancels the external magnetic field by providing an electrical current, corresponding to the detected external magnetic field, to the compensation coil. A search coil and compensation coil also can be provided in a similar manner downstream of a second projection lens, and provided with a respective external-magnetic-field-detection circuit and external-magnetic-field-compensation circuit.

15 Claims, 3 Drawing Sheets

METHODS AND DEVICES FOR DETECTING AND CANCELING MAGNETIC FIELDS EXTERNAL TO A CHARGED-PARTICLE-BEAM (CPB) OPTICAL SYSTEM, AND CPB MICROLITHOGRAPHY APPARATUS AND METHODS COMPRISING SAME

FIELD

This disclosure pertains to microlithography, which is a key technique used in the manufacture of microelectronic devices such as integrated circuits, displays, thin-film magnetic pickup heads, and micromachines. Microlithography generally involves the imaging of a pattern, usually defined by a reticle or mask, onto a surface of a substrate having a layer (termed a "resist") imprintable with the image in a manner similar to photography. More specifically, this disclosure pertains to microlithography performed using a charged particle beam as an energy beam, instead of a beam of ultraviolet light as used currently in optical microlithography. Even more specifically, the disclosure pertains to methods and devices for detecting and compensating for stray floating magnetic fields so as to prevent adverse effects of such fields on the charged particle beam during image transfer.

BACKGROUND

It is well known that the level of integration of microelectronic devices has continued to increase, accompanied by ever greater miniaturization and density of individual components of the microelectronic devices. The level of integration now has reached a level in which minimum linewidths of pattern features as imaged on the substrate are about 100 nm. It is becoming rapidly impossible at this level of integration and miniaturization to use conventional optical microlithography for pattern transfer because the required resolution exceeds the diffraction limit of optical microlithography. As a result, substantial effort is being made to develop a practical "next generation" microlithography technology.

An important candidate next-generation microlithography technology is step-and-repeat microlithography performed using a charged particle beam such as an electron beam or ion beam. Electron-beam microlithography offers prospects of substantially greater pattern-transfer resolution for reasons similar to reasons why electron microscopy provides substantially better imaging resolution than obtained using optical microscopy.

Whenever a charged-particle-beam (CPB) microlithography apparatus is used for transferring a pattern from a reticle to a sensitive substrate, a commonly encountered problem is disturbance of the trajectory of the charged particle beam by external floating magnetic fields. These disturbances adversely affect pattern-transfer accuracy and resolution. A conventional remedy is to employ three Helmholtz coils (one for each of the x-axis, y-axis, and z-axis directions, each being about 50 cm in diameter, and individually having mutually perpendicular respective axes) positioned about 4 m from the CPB microlithography apparatus. The coils are supplied with respective electrical currents with the objective of causing the respective coils to generate respective countervailing magnetic fields that collectively cancel at least a portion of the floating magnetic field.

Unfortunately, experience has shown that use of Helmholtz coils configured as described above interferes with other peripheral power sources, and requires a substantially larger clean-room facility to house the CPB microlithography apparatus. Also, the efficiency with which floating magnetic fields actually are shielded using this approach (i.e., the "shielding ratio") is limited to approximately $\frac{1}{10}$, which is insufficient for attaining satisfactory results. Another problem with this approach is that it is ineffective for canceling stray magnetic fields produced by sources (e.g., linear motors used for actuating the reticle and substrate stages) located between the optical axis of the CPB microlithography apparatus and the Helmholtz coils.

SUMMARY

In view of the shortcomings of conventional approaches for reducing floating magnetic fields, as summarized above, the present invention provides, inter alia, charged-particle-beam (CPB) microlithography systems exhibiting improved cancellation of floating magnetic fields with an improved shielding ratio, without having to enlarge the system excessively.

To such ends, a first aspect of the invention is directed to CPB microlithography systems that comprise, on an optical axis, a CPB optical system that includes an illumination-optical system and a projection-optical system. The illumination-optical system illuminates a selected region on a reticle with a charged-particle illumination beam to form a patterned beam carrying an aerial image of the illuminated region on the reticle. The projection-optical system causes the patterned beam to form an actual image of the illuminated region on a surface of a substrate. In the context of such systems, according to the first aspect of the invention, devices are provided for detecting and canceling magnetic fields external to the CPB optical system. An embodiment of such a device comprises a magnetic-field sensor situated and configured to detect a magnetic field external to the CPB optical system. The embodiment also comprises a magnetic-field-compensation coil situated between the illumination-optical system and the projection-optical system or between the projection-optical system and the wafer stage. The embodiment also includes a magnetic-field-compensation circuit connected to the magnetic-field-compensation coil and configured to adjust an electrical current delivered to the magnetic-field-compensation coil so as to cause the magnetic-field-compensation coil to produce a magnetic field that cancels at least a portion of the external magnetic field detected by the magnetic-field sensor.

Thus, external magnetic fields (including magnetic fields of a fluctuating or floating nature, are detected using a magnetic-field sensor that is provided within the CPB optical system and thus within the CPB microlithography system. At least one electrical current is delivered to the magnetic-field-compensation coil in a manner that causes the magnetic-field-compensation coil to produce a magnetic field that cancels at least a portion of the external magnetic fields. Hence, the external magnetic fields are locally canceled using relatively small coils, compared to conventional field-canceling devices. Consequently, large-scale equipment is not needed for canceling the external fields. The effect of the magnetic-field-compensation coil desirably is combined with the shielding effects of any ferromagnetic shielding enveloping the CPB optical system.

Using a device according to this embodiment, it is possible to achieve a shielding ratio of better than $\frac{1}{30}$ against floating external magnetic fields. The external magnetic fields that are effectively canceled principally include external magnetic fields generated by equipment other than the CPB microlithography system.

The reticle typically is mounted on a reticle stage situated between the illumination-optical system and the projection-optical system. In such a system configuration, the magnetic-field sensor and the magnetic-field-compensation coil desirably are situated between the illumination-optical system and the reticle stage. Generally, the axial space between the illumination-optical system and the reticle is wider than the respective space between the reticle and the projection-optical system. Hence, placing the magnetic-field sensor and magnetic-field-compensation coil between the illumination-optical system and the reticle stage provides efficient utilization of space in the CPB microlithography system.

Further desirably, each of the magnetic-field sensor and magnetic-field-compensation coil comprises a respective set of three coils, one coil for each of an x-axis direction, a y-axis direction, and a z-axis direction, respectively, of a Cartesian coordinate system, wherein the optical axis is parallel to the z-axis direction. The coils of the magnetic-field sensor detect the external magnetic field in the x-axis, y-axis, and z-axis directions, respectively. The coils of the magnetic-field-compensation coil generate respective magnetic fields in the x-axis, y-axis, and z-axis directions, respectively. Thus, external magnetic fields oriented in any direction in three-dimensional space can be detected independently and independently canceled.

The coils of the magnetic-field sensor desirably comprise three coils. In such a configuration, one of the coils is a z-axis coil that is wound about the z-axis and configured to detect a magnetic field in the z-axis direction. A second coil is an x-axis coil wound about an axis parallel to the y-axis and configured to detect a magnetic field in the x-axis direction. The third coil is a y-axis coil wound about an axis parallel to the x-axis and configured to detect a magnetic field in the y-axis direction.

Similarly, the coils of the magnetic-field-compensation coil desirably comprise three coils. In such a configuration, one of the coils is a z-axis coil wound about the z-axis and configured to generate a magnetic field oriented in the z-axis direction. Another of the coils is an x-axis coil wound about an axis parallel to the y-axis and configured to generate a magnetic field oriented in the x-axis direction, and yet another of the coils is a y-axis coil wound about an axis parallel to the x-axis and configured to generate a magnetic field in the y-axis direction.

The magnetic-field sensor desirably is displaced from the optical axis farther than the magnetic-field-compensation coil. By placing the magnetic-field sensor at a position laterally separated from the z axis, external magnetic fields can be detected accurately without detection being influenced by internal magnetic fields. Also, by placing the magnetic-field-compensation coil nearer the z-axis than the magnetic-field sensor, it is possible to effectively compensate for magnetic fields in the vicinity of the optical axis.

The device can be configured such that the magnetic-field sensor comprises a coil configured to serve as both a magnetic-field sensor coil and a magnetic-field-compensation coil. In this configuration, the magnetic-field sensor and the magnetic-field-compensation coil are combined to provide a commensurate reduction in the number of components of the CPB optical system, allowing the system to be made more compact. With such a configuration, rather than regulating the electrical current flowing to the compensation coil in a manner that reduces the magnetic field detected by the coil becomes substantially to zero magnitude, the specific multiple ratio of the detected magnetic field relative to the generated magnetic field top the generated magnetic field can be experimentally determined. The compensating electrical current has a magnitude established according to the ratio. This allows, for the first time, the effects of external magnetic fields to be completely canceled.

In addition, by using a coil a magnetic sensor to measure floating magnetic fields between exposures and using a coil for generating a compensating magnetic field during exposures, passing an electric current through the coil negates the measured floating magnetic field.

According to another aspect of the invention, methods are provided, in the context of CPB microlithography methods, for detecting and canceling magnetic fields external to a CPB optical system. In an embodiment of such a method, a magnetic field external to the CPB optical system is detected. A magnetic-field-compensation coil is placed relative to the CPB optical system. Based on the detected external magnetic field, electric current is supplied to the magnetic-field-compensation coil to produce a corresponding magnetic field that cancels at least a portion of the detected external magnetic field.

The method can further include the step of determining a ratio of the detected external magnetic field and the electric current supplied to the magnetic-field-compensation coil in advance. The electric current supplied to the magnetic-field-compensation coil is determined based on the detected external magnetic field and the ratio.

The foregoing and additional features and advantages of the invention will be more readily apparent from the following detailed description, which proceeds with reference to the accompanying drawings.

DETAILED DESCRIPTION

The invention is described in the context of representative embodiments, which are not intended to be limiting in any way.

Figure 1:
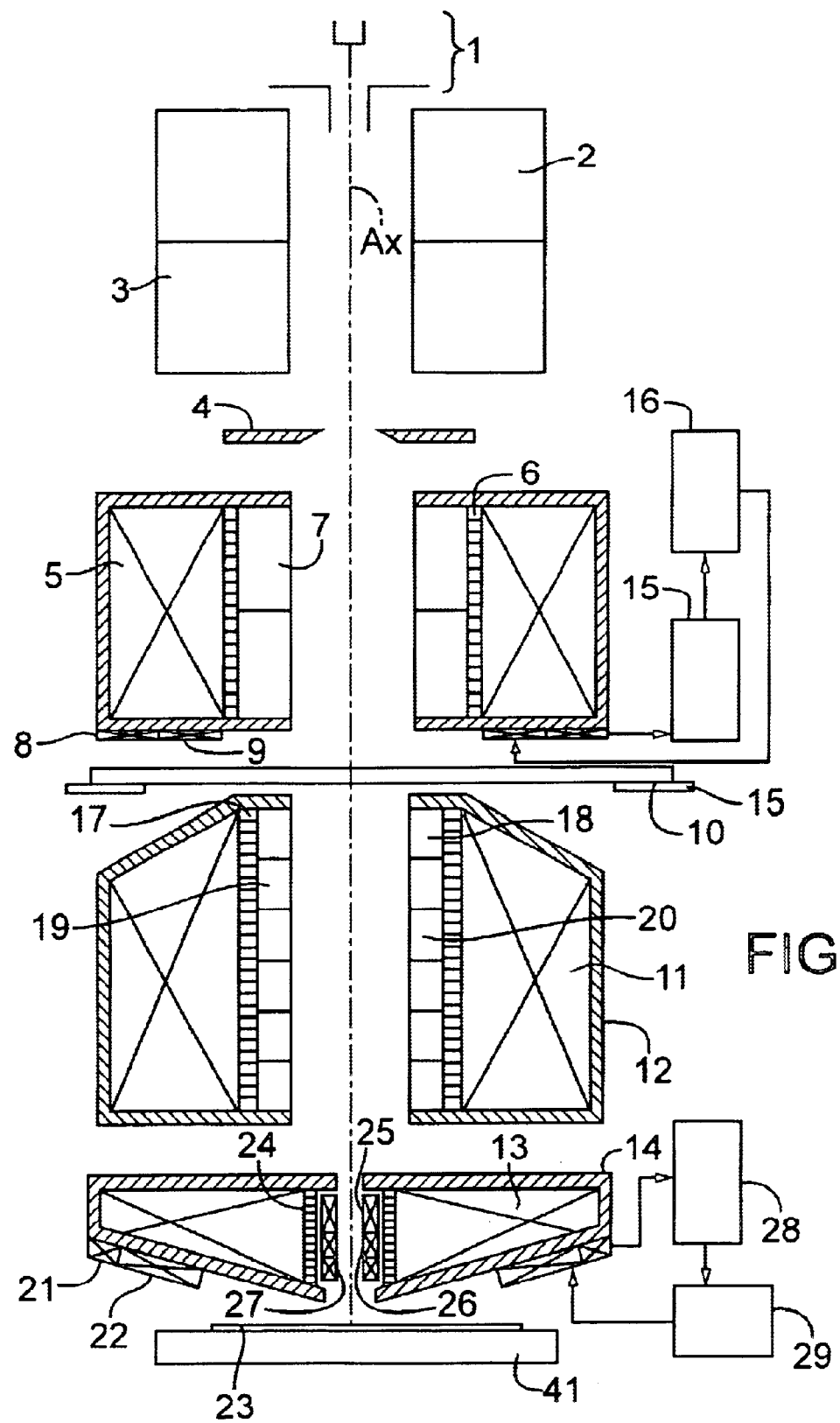
FIG. 1 is an elevational, partially sectional, view of a representative embodiment of a charged-particle-beam (CPB) optical system especially configured for used in a CPB microlithography apparatus.

A representative embodiment of a charged-particle-beam (CPB) microlithography system ("exposure apparatus") is depicted in FIG. 1. FIG. 1 is described in the context of using an electron beam as an exemplary charged particle beam. However, it will be understood that the principles of FIG. 1 can be applied with equal facility to use of another type of charged particle beam, such as an ion beam.

The system shown in FIG. 1 includes an electron gun 1 situated at the extreme upstream end of an optical axis Ax. Downstream of the electron gun 1 are two condenser lenses 2, 3. An electron beam (termed an "illumination beam") produced by the electron gun 1 passes through and is condensed by the condenser lenses 2, 3 for passage through a beam-shaping aperture 4. Thus, off-axis portions of the illumination beam are trimmed by passage of the beam through the beam-shaping aperture 4 to illuminate a desired area on a downstream reticle 10. From the beam-shaping aperture 4, the illumination beam passes through an illumination lens 5. Associated with the illumination lens 5 are a ferrite stack 6, a beam-deflecting coil (with dynamic compensation lens) 7, a magnetic-field sensor ("search coil") 8, a magnetic-field-compensation coil 9, a magnetic-field-detection circuit 15, and a magnetic-field-compensation circuit 16. From the illumination lens 5, the illumination beam propagates to the reticle 10. These components located upstream of the reticle 10 constitute an "illumination-optical system" of the CPB exposure apparatus.

Between the reticle 10 and a substrate 23 located downstream of the reticle 10 is the "projection-optical system," which comprises a first projection lens 11 and a second projection lens 13. Associated with the first projection lens 11 are a lens core (pole piece) 12, a ferrite stack 17, a beam-deflecting coil 18, a dynamic compensation lens 19, and a dynamic stigmator 20. Associated with the second projection lens 13 are a lens core (pole piece) 14, a ferrite stack 24, a beam-deflecting coil 25, a dynamic compensation lens 26, a dynamic stigmator 27, a magnetic-field sensor ("search coil") 21, a magnetic-field-compensation coil 22, a magnetic-field-detection circuit 28, and a magnetic-field-compensation circuit 29.

An illumination beam (from the electron gun 1) condensed by the condenser lenses 2, 3 and trimmed by the beam-shaping aperture 4 is provided with a uniform transverse beam intensity. After passing through the illumination lens 5, the illumination beam 4 illuminates the desired region on the reticle 10 at uniform intensity over the illuminated region. Typically, the illuminated region of the reticle is a "subfield." Passage of the illumination beam through the illuminated subfield of the reticle 10 "patterns" the beam (i.e., the beam acquires an aerial image of the illuminated region of the reticle). Thus, the beam propagating downstream of the reticle is termed a "patterned beam" that propagates from the reticle 10 to a corresponding region on the substrate 23. An image of the illuminated region of the reticle 10 is formed on the substrate 23 by passage of the patterned beam through the first and second projection lenses 11, 13, respectively. So as to be imprintable with the projected image, the upstream-facing surface of the substrate 23 is coated with a substance termed a "resist." After completing exposure of a subfield in this manner, the illumination beam is laterally deflected appropriately by the beam-deflecting coil 7 in a main deflection direction (perpendicular to the optical axis Ax) to illuminate the next subfield on the reticle 10.

Thus, the subfields of the reticle 10 are illuminated (and "transferred" to the substrate 23) in a sequential manner. To facilitate this subfield-by-subfield transfer, the subfields are arranged in rows and columns on the reticle 10, wherein each row extends in the main deflection direction of the beam-deflecting coil 7. With such an arrangement of subfields, the beam-deflecting coil 7 "scans" the subfields in a row in a sequential manner. Meanwhile, the reticle 10 and substrate 23 (situated on respective stages 40, 41) are continuously moving at respective lateral velocities in respective opposite directions that are perpendicular to the main deflection direction and to the optical axis Ax. This exposure scheme is repeated as required to expose all the subfields on the reticle 10 to a die on the substrate 23. (The substrate 23 typically is a semiconductor wafer capable of being exposed with multiple "dies" each corresponding to a separate microelectronic device being formed on the substrate.) During this exposure process, the actions of the dynamic compensation lenses 19, 26, the lens cores 12, 14, the ferrite stacks 17, 24, and the dynamic stigmators 20, 27 are well known, and explanations of these components are not provided here.

In the embodiment shown in FIG. 1, the search coil 8 and the magnetic-field-compensation coil 9 are situated adjacent a downstream-facing surface of the illumination lens 5. As a magnetic-field sensor, the search coil 8 detects external magnetic fields that could, if not canceled, penetrate into the CPB optical system to the optical axis. The search coil 8 is connected to the magnetic-field-detection circuit 15. An external magnetic field detected by the search coil 8 is converted to a corresponding electrical signal by the magnetic-field-detection circuit 15, which routes the signal to the magnetic-field-compensation circuit 16. In response to the signal, the magnetic-field-compensation circuit 16 supplies to the magnetic-field-compensation coil 9 an electrical current having a direction and magnitude sufficient to cause the magnetic-field-compensation coil 9 to generate an external-field-canceling magnetic field. The external-field-canceling magnetic field has a direction and magnitude that cancels at least a portion of the detected external magnetic field.

In a similar manner, the search coil 21 and magnetic-field-compensation coil 22 are situated adjacent a downstream-facing surface of the second projection lens 13. An external magnetic field detected by the search coil 21 is converted to a corresponding electrical signal by the magnetic-field-detection circuit 28, which routes the signal to the magnetic-field-compensation circuit 29. In response to the signal, the magnetic-field-compensation circuit 29 supplies to the magnetic-field-compensation coil 22 an electrical current having a direction and magnitude sufficient to cause the magnetic-field-compensation coil 22 to generate an external-field-canceling magnetic field. The external-field-canceling magnetic field has a direction and magnitude that cancels at least a portion of the detected external magnetic field.

Figure 2A:
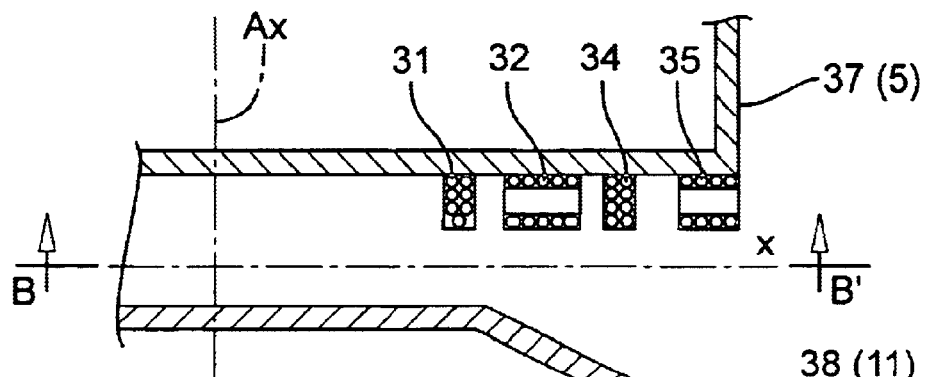
FIG. 2(a) is an elevational section of a portion of the CPB optical system of FIG. 1, showing sectional details of certain of the magnetic-field-compensation coils and certain of the search coils associated with the illumination lens. The view in FIG. 2(a) is along the line A—A' in FIG. 2(b).
Figure 2B:
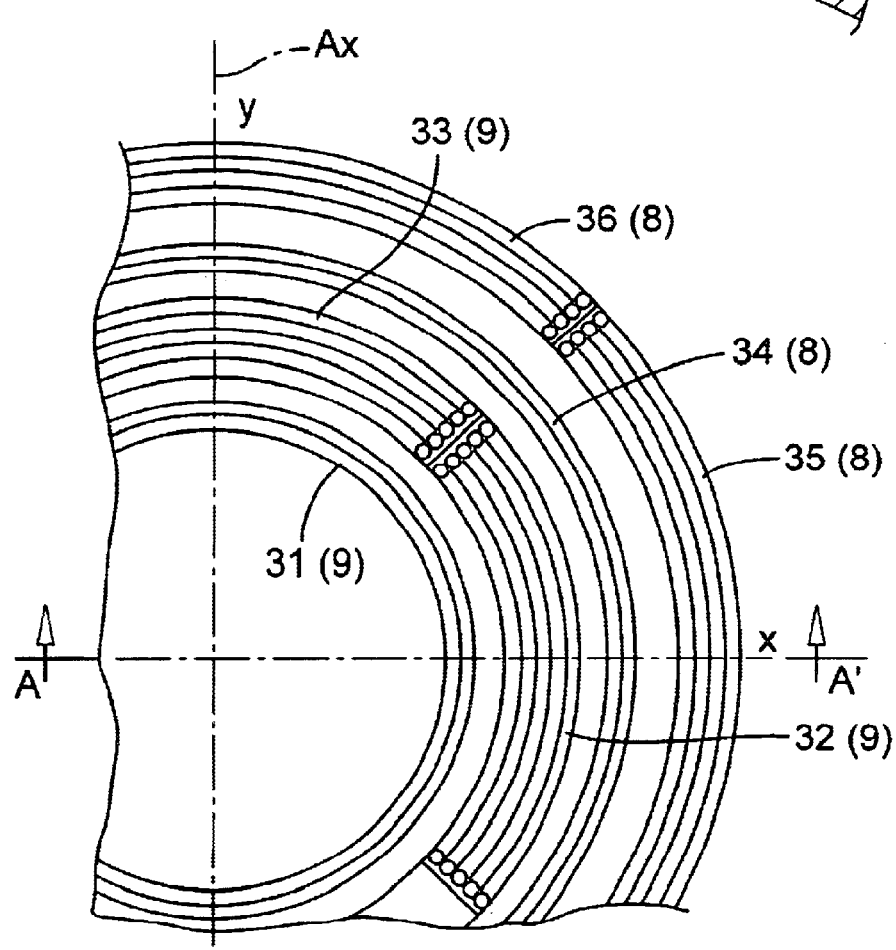
FIG. 2(b) is a plan (and partial sectional view) along the line B—B' in FIG. 2(a).

A representative embodiment of an arrangement of the search coil 8 and the magnetic-field-compensation coil 9 is shown in FIGS. 2(*a*)–2(*b*). FIG. 2(*a*) is an elevational section along the line A–A' in FIG. 2(*b*), and FIG. 2(*b*) is an "underside" plan view along the line B–B' in FIG. 2(*a*). The magnetic-field-compensation coil 9 comprises three separate compensation coils, one for each Cartesian axis. Specifically, item 31 is a z-axis-direction magnetic-field-compensation coil, item 32 is an x-axis-direction magnetic-field-compensation coil, and item 33 is a y-axis-direction magnetic-field-compensation coil. In a similar manner, the search coil 8 comprises three separate coils, one for each Cartesian axis. Specifically, item 34 is a z-axis-direction search coil, item 35 is an x-axis-direction search coil, and item 36 is a y-axis-direction search coil. Item 37 is the pole piece of the illumination lens 5, and item 38 is the pole piece of the first projection lens 11.

The search coils 34, 35, 36 and compensation coils 31, 32, 33 for the respective axial directions are attached, in this embodiment, to the pole piece 37 of the illumination lens 5. At an axial location closest to the axis Ax, the z-axis-direction magnetic-field-compensation coil 31 is wound concentrically about the axis Ax (i.e., the z-axis). When the coil 31 is electrically energized, the current flows circumferentially around the z-axis, which causes the coil 31 to produce a magnetic field extending in the z-axis direction. This magnetic field is symmetrical about the axis Ax and centered on the z-axis, and serves to cancel a z-axis component of an external magnetic field.

In the next position outward from the axis Ax, the x-axis-direction magnetic-field-compensation coil 32 and the y-axis-direction magnetic-field-compensation coil 33 are situated. The x-axis-direction compensation coil 32 actually includes two coils each wound in a saddle-like manner between −45° and +45°, respectively, in the figure at respective locations providing the coil 32 with y-axis symmetry. Such a configuration causes the coils 32 collectively to produce an x-axis-direction magnetic field whenever they are electrically energized. This x-axis-direction magnetic field serves to cancel an x-axis component of the external magnetic field.

In the same manner, the y-axis-direction magnetic-field-compensation coil 33 actually includes two coils each wound in a saddle-like manner between 45° and 135°, respectively, in the figure at respective locations providing the coil 33 with x-axis symmetry. Such a configuration causes the coils 33 collectively to produce a y-axis-direction magnetic field whenever they are electrically energized. This y-axis-direction magnetic field serves to cancel a y-axis component of an external magnetic field.

In the next radially outward position, the z-axis-direction search coil 34 is wound in the same manner as the z-axis-direction magnetic-field-compensation coil 31. Thus, the z-axis-direction search coil 34 detects the z-axis components of external magnetic fields. In a further radially outward position, the x-axis-direction search coil 35 and the y-axis-direction search coil 36 are situated. These search coils 35, 36 are wound in the same respective manner as the x-axis-direction magnetic-field-compensation coil 32 and the y-axis-direction magnetic-field-compensation coil 33, respectively. Thus, the search coils 35, 36 respectively detect the x-axis components and y-axis components of external magnetic fields.

In this embodiment, the respective search coils 34, 35, 36 are situated radially outside the magnetic-field-compensation coils 31, 32, 33 so as to prevent the magnetic fields produced by more radially inwardly located components such as beam-deflecting coils, dynamic compensation lenses, and stigmators from reaching the search coils 34, 35, 36. Thus, the search coils 34, 35, 36 detect only "external" magnetic fields. The magnetic-field-compensation coils 31, 32, 33 are situated relatively closely to the optical axis Ax so that the respective compensations can be performed using electrical currents that are as small as possible.

The configuration described above is exemplary for the search coils 34, 35, 36 and magnetic-field-compensation coils 31, 32, 33 situated between the illumination-optical system and the projection-optical system. It will be understood that the same principles apply to search coils and magnetic-field-compensation coils provided between the projection-optical system and the substrate stage 41 (FIG. 1).

The following example is directed to performing magnetic-field compensation using search coils and magnetic-field-compensation coils configured as described above.

Specifically, a Helmholtz coil was situated at a position that is radially outside the circumference of the search coils, thereby being separated from the optical axis Ax. The Helmholtz coil was energized to generate a uniform "external" magnetic field. Using such a configuration, the electrical current $Is_8$ flowing in the search coil 8 and the corresponding perturbation of the beam on the optical axis were detected. The external field was detected by the search coil 8, which delivered a corresponding electrical current (via the magnetic-field-detection circuit 15 and magnetic-field-compensation circuit 16) to the magnetic-field-compensation coil 9 to produce a corresponding magnetic field serving to cancel the external field. The resulting cancellation of the external magnetic field reduced beam-trajectory perturbation by the external field to zero.

If the magnitude of electrical current delivered to the magnetic-field-compensation coil 9 to reduce beam perturbation to zero is denoted $Ic_8$, then the ratio of $Ic_8$ and $Is_8$ is $Ic_8/Is_8=k$, wherein k is a constant. At the time of compensation, if an electrical current (denoted "Is") is detected by the search coil 8, then an electrical current equal to k·Is is caused to flow to the magnetic-field-compensation circuit. This compensation scheme is implemented independently in the x-, y-, and z-axis directions.

In the foregoing example, instead of monitoring perturbation of beam trajectory, it also is possible to monitor the penetration of the external magnetic field using a magnetic-field detector situated in the vicinity of the optical axis Ax.

In the embodiment described above, the search coils and respective magnetic-field-compensation coils are configured so as to be located separately from each other. Alternatively, selected coils can be combined to provide shared functions. Specifically, the numerical factor by which the electrical current detected by the search coil is related to the opposite-phase electrical current required for reducing beam perturbation to zero can be determined experimentally in advance. Upon detection of an electrical current by the search coil, an electrical current corresponding to that ratio can be delivered to the respective compensation coil. In addition, in a step-and-repeat exposure apparatus, there is a prescribed time interval from exposure of one subfield to exposure of the next subfield, during which interval measurements of external magnetic fields can be performed. External-magnetic-field compensations may be performed using the same coils during exposure.

Figure 3:
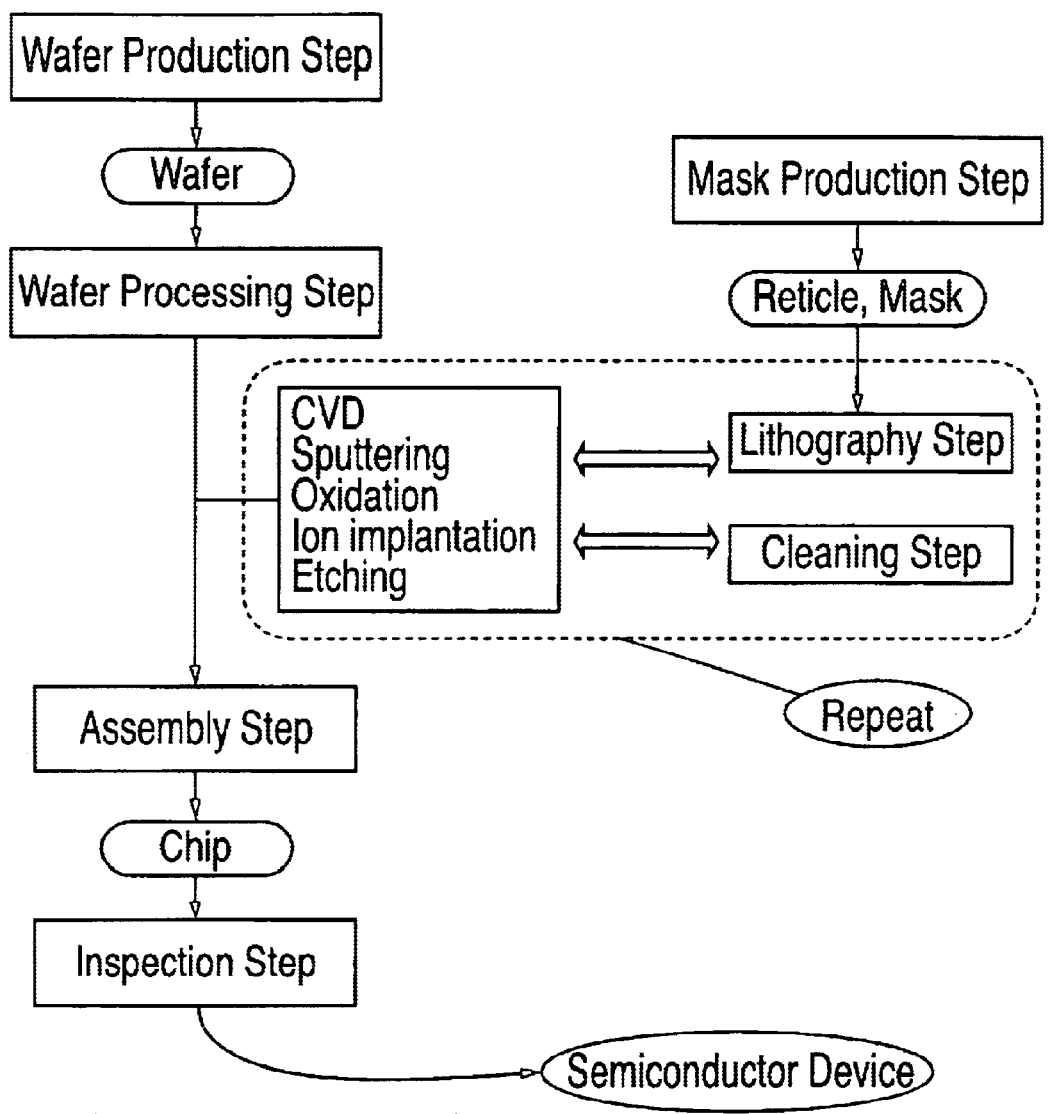
FIG. 3 is a process flow chart depicting certain steps in a microelectronic-device manufacturing method.

FIG. 3 is a flowchart of an exemplary microelectronic-device fabrication method to which apparatus and methods according to the invention can be applied readily. The fabrication method generally comprises the main steps of wafer production (wafer preparation), wafer processing, device assembly, and device inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired semiconductor chips on the wafer.

Figure 4:
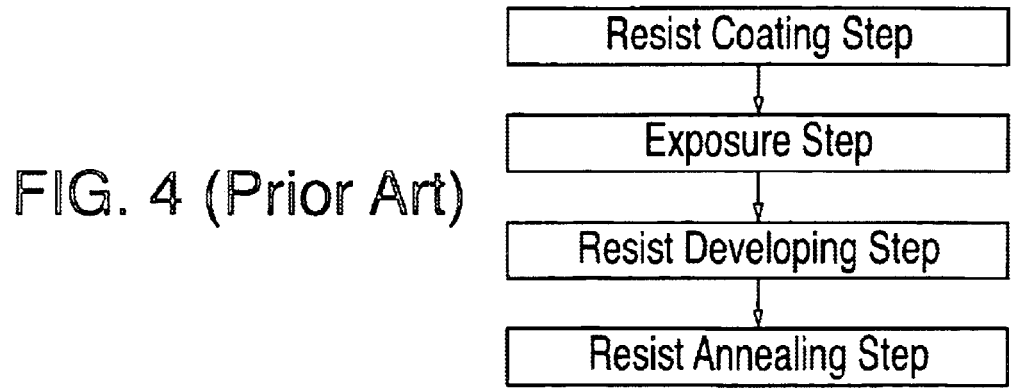
FIG. 4 is a process flow chart depicting certain steps in a microlithography step of the method shown in FIG. 3.

FIG. 4 provides a flow chart of typical steps performed in microlithography, which is a principal step in wafer processing. The microlithography step typically includes: (1) resist-application step, wherein a suitable resist is coated on the wafer substrate (which can include a circuit element formed in a previous wafer-processing step); (2) exposure step, to expose the resist with the desired pattern; (3) development step, to develop the exposed resist to produce the imprinted image; and (4) optional resist-annealing step, to enhance the durability of the resist pattern.

The process steps summarized above are all well known and are not described further herein.

Methods and apparatus according to the invention can be applied to a microelectronic-device fabrication process, as summarized above, to provide improved accuracy and precision of microlithographic exposure without sacrificing throughput. Specifically, microlithography is performed using a CPB exposure apparatus, as described above, that provides greater negation of stray floating magnetic fields.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography system comprising, on an optical axis, a CPB optical system including an illumination-optical system and a projection-optical system, wherein the illumination-optical system illuminates a selected region on a reticle with a charged-particle illumination beam to form a patterned beam carrying an aerial image of the illuminated reticle region, and the projection-optical system causes the patterned beam to form an actual image of the illuminated reticle region on a corresponding region on a surface of a substrate, a device for detecting and canceling magnetic fields external to the CPB optical system, comprising:

a magnetic-field sensor situated and configured to detect a magnetic field external to the CPB optical system;

a magnetic-field-compensation coil situated between the illumination-optical system and the projection-optical system or between the projection-optical system and the substrate; and a magnetic-field-compensation circuit connected to the magnetic-field-compensation coil and configured to deliver an electrical current to the magnetic-field-compensation coil sufficient in direction and magnitude to cause the magnetic-field-compensation coil to produce a corresponding magnetic field that cancels at least a portion of the external magnetic field detected by the magnetic-field sensor.

2. The device of claim 1, wherein:

the microlithography system comprises a reticle stage situated between the illumination-optical system and the projection-optical system;

the reticle is mounted on the reticle stage; and the magnetic-field sensor and the magnetic-field-compensation coil are situated between the illumination-optical system and the reticle stage.

3. The device of claim 1, wherein:

the magnetic-field sensor and magnetic-field-compensation coil each comprise a respective set of three coils, one coil for each of an x-axis direction, a y-axis direction, and a z-axis direction, respectively, of a Cartesian coordinate system of the CPB optical system, wherein the optical axis is parallel to the z-axis direction;

the coils of the magnetic-field sensor detect respective components of the external magnetic field in the x-axis, y-axis, and z-axis directions, respectively; and the coils of the magnetic-field-compensation coil generate respective magnetic fields in the x-axis, y-axis, and z-axis directions, respectively.

4. The device of claim 3, wherein the coils of the magnetic-field sensor comprise:

a z-axis coil wound about the z-axis and configured to detect a magnetic field in the z-axis direction;

an x-axis coil wound about an axis parallel to the x-axis and configured to detect a magnetic field in the x-axis direction; and a y-axis coil wound about an axis parallel to the y-axis and configured to detect a magnetic field in the y-axis direction.

5. The device of claim 4, wherein the coils of the magnetic-field-compensation coil comprise:

a z-axis coil wound about the z-axis and configured to generate a magnetic field oriented in the z-axis direction;

an x-axis coil wound about an axis parallel to the y-axis and configured to generate a magnetic field oriented in the x-axis direction; and a y-axis coil wound about an axis parallel to the x-axis and configured to generate a magnetic field in the y-axis direction.

6. The device of claim 1, wherein the magnetic-field sensor is displaced from the optical axis farther than the magnetic-field-compensation coil.

7. The device of claim 1, wherein the magnetic-field sensor comprises a coil configured to serve as both a magnetic-field sensor coil and a magnetic-field-compensation coil.

8. The device of claim 1, further comprising:

a first magnetic-field sensor and a first magnetic-field-compensation coil situated between the illumination-optical system and the projection-optical system;

a second magnetic-field sensor and a second magnetic-field-compensation coil situated between the projection-optical system and the substrate stage;

a first magnetic-field-compensation circuit connected to the first magnetic-field-compensation coil; and a second magnetic-field-compensation circuit connected to the second magnetic-field-compensation coil.

9. The device of claim 8, wherein:

each of the first and second magnetic-field sensors and each of the first and second magnetic-field-compensation coils comprises a respective set of three coils, one coil for each of an x-axis direction, a y-axis direction, and a z-axis direction, respectively, of a Cartesian coordinate system of the CPB optical system, wherein the optical axis is parallel to the z-axis direction;

the respective coils of each magnetic-field sensor detect respective components of the external magnetic field in the x-axis, y-axis, and z-axis directions, respectively, and the respective coils of each magnetic-field-compensation coil generate respective magnetic fields in the x-axis, y-axis, and z-axis directions, respectively.

10. The device of claim 9, wherein the coils of each magnetic-field sensor comprise:
   a respective z-axis coil wound about the z-axis and configured to detect a magnetic field in the z-axis direction;
   a respective x-axis coil wound about an axis parallel to the y-axis and configured to detect a magnetic field in the x-axis direction; and
   a respective y-axis coil wound about an axis parallel to the x-axis and configured to detect a magnetic field in the y-axis direction.

11. In a charged-particle-beam (CPB) microlithography method in which an illumination beam is directed by a CPB illumination-optical system onto a selected region of a pattern-defining reticle to produce a patterned beam carrying an aerial image of the illuminated reticle region, and the pattern beam is caused by a CPB projection-optical system, situated downstream of the illumination-optical system, to form an actual image of the illuminated reticle region on a corresponding region on a surface of a substrate, a method for detecting and canceling magnetic fields external to the CPB optical system, the method comprising:
   detecting a magnetic field external to the CPB illumination-optical and projection-optical systems;
   placing a magnetic-field-compensation coil between the CPB illumination-optical system and CPB projection-optical system or between the CPB projection-optical system and the substrate; and
   based on the detected external magnetic field, supplying electric current to the magnetic-field-compensation coil to produce a corresponding magnetic field that cancels at least a portion of the detected external magnetic field.

12. The method of claim 11, further comprising the steps of:
   determining a ratio of the detected external magnetic field and the electric current supplied to the magnetic-field-compensation coil in advance; and
   determining the electric current supplied to the magnetic-field-compensation coil based on the detected external magnetic field and the ratio.

13. A charged-particle-beam (CPB) optical system, comprising;
   an illumination-optical system situated upstream of a reticle along an optical axis;
   a projection-optical system situated along the optical axis, downstream of the reticle and upstream of a substrate; and
   a device for detecting and canceling magnetic fields external to the CPB optical system, the device comprising (i) a magnetic-field sensor situated and configured to detect a magnetic field external to the illumination-optical system and projection-optical system, (ii) a magnetic-field-compensation coil situated between the illumination-optical system and the projection-optical system or between the projection-optical system and the substrate, and (iii) a magnetic-field-compensation circuit connected to the magnetic-field-compensation coil and configured to deliver an electrical current to the magnetic-field-compensation coil to produce a corresponding magnetic field that cancels at least a portion of the external magnetic field detected by the magnetic-field sensor.

14. A charged-particle-beam (CPB) microlithography process, comprising:
   using a CPB illumination-optical system situated along an optical axis, directing an illumination beam onto a selected region of a pattern-defining reticle to produce a patterned beam carrying an aerial image of the illuminated reticle region;
   using a CPB projection-optical system situated along the optical axis, causing the patterned beam to form an actual image of the illuminated reticle region on a corresponding region on a surface of a substrate situated downstream of the projection-optical system;
   detecting a magnetic field external to the illumination-optical system and projection-optical system;
   in response to the detected external magnetic field, producing a corresponding magnetic field locally in the vicinity of the optical axis either between the illumination-optical system and the projection-optical system or between the projection-optical system and the substrate so as to cancel at least a portion of the detected external magnetic field.

15. A process for manufacturing a microelectronic device, comprising:
   performing a CPB microlithography step in which an illumination beam is directed by an illumination-optical system, situated along an optical axis, onto a selected region of a pattern-defining reticle to produce a patterned bean carrying an aerial image of the illuminated reticle region, and the patterned beam is directed by a projection-optical system, situated on the optical axis downstream of the illumination-optical system, to form an actual image of the illuminated reticle region on a corresponding region on a surface of a substrate situated downstream of the projection-optical system;
   detecting a magnetic field external to the illumination-optical system and projection-optical system; and
   in response to the detected external magnetic field, producing a corresponding magnetic field locally in the vicinity of the optical axis either between the illumination-optical system and the projection-optical system or between the projection-optical system and the substrate so as to cancel at least a portion of the detected external magnetic field.

* * * * *

UNITED STATES PATENT AND TRADEMARK OFFICE
CERTIFICATE OF CORRECTION

PATENT NO. : 6,831,281 B2  
DATED : December 14, 2004  
INVENTOR(S) : Nakasuji

It is certified that error appears in the above-identified patent and that said Letters Patent is hereby corrected as shown below:

Column 4,
Line 7, "coil a" should be -- coil as a --.

Column 10,
Line 66, "respectively, and" should be -- respectively; and --.

Signed and Sealed this

Twenty-fourth Day of May, 2005

JON W. DUDAS
*Director of the United States Patent and Trademark Office*